United States Patent
Takayama

(10) Patent No.: US 8,806,120 B2
(45) Date of Patent: Aug. 12, 2014

(54) DECODING DEVICE AND DECODING METHOD

(71) Applicant: Panasonic Corporation, Osaka (JP)

(72) Inventor: Tsuyoshi Takayama, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/799,844

(22) Filed: Mar. 13, 2013

(65) Prior Publication Data

US 2013/0201040 A1 Aug. 8, 2013

Related U.S. Application Data

(63) Continuation of application No. PCT/JP2011/002652, filed on May 12, 2011.

(30) Foreign Application Priority Data

Sep. 22, 2010 (JP) ................................. 2010-212851

(51) Int. Cl.
*G06F 12/00* (2006.01)
*H03M 7/00* (2006.01)

(52) U.S. Cl.
USPC ............................................. 711/112; 341/50

(58) Field of Classification Search
CPC ........... H04N 19/00472; H04N 21/235; H04L 67/06; H04L 67/325
See application file for complete search history.

(56) References Cited

U.S. PATENT DOCUMENTS

| | | | |
|---|---|---|---|
| 7,652,964 B2 | 1/2010 | Nozaki | |
| 8,032,696 B2 * | 10/2011 | Takayama et al. | ............ 711/112 |
| 8,156,072 B2 | 4/2012 | Lam et al. | |
| 2003/0018610 A1 * | 1/2003 | Ryu | ................................... 707/1 |
| 2003/0049017 A1 * | 3/2003 | Chung et al. | ..................... 386/95 |
| 2003/0063897 A1 * | 4/2003 | Heo | ................................. 386/95 |
| 2003/0158737 A1 * | 8/2003 | Csicsatka | ...................... 704/273 |
| 2004/0039575 A1 * | 2/2004 | Bum | ............................ 704/500 |

(Continued)

FOREIGN PATENT DOCUMENTS

| | | |
|---|---|---|
| JP | 2007-501988 | 2/2007 |
| JP | 2007-323696 | 12/2007 |

(Continued)

OTHER PUBLICATIONS

International Search Report of PCT Application No. PCT/JP2011/002652, dated Jun. 14, 2011.

*Primary Examiner* — Hyun Nam
(74) *Attorney, Agent, or Firm* — McDermott Will & Emery LLP

(57) ABSTRACT

A decoding device includes an interface unit, a readout unit that reads out a file and recording medium management information from an external recording medium, a decoding unit that analyzes a read out file, a storage unit that stores file analysis information and recording medium management information, a determination unit that determines whether or not the recording medium management information pieces are the same when the external recording medium is connected to the interface unit, and a matching confirmation unit that, when the recording medium management information pieces are determined as being the same, determines whether or not the file contents match. When the determination results in a mismatch, the decoding unit generates new file analysis information and performs file decoding using the generated file analysis information, and when the determination results in a match, the decoding unit performs file decoding using the file analysis information in the storage unit.

22 Claims, 7 Drawing Sheets

(56) References Cited

U.S. PATENT DOCUMENTS

| | | | |
|---|---|---|---|
| 2004/0184778 A1* | 9/2004 | Jung et al. | 386/95 |
| 2007/0198453 A1 | 8/2007 | Lam et al. | |
| 2007/0280076 A1 | 12/2007 | Nozaki | |
| 2009/0204568 A1* | 8/2009 | Takayama et al. | 707/1 |

FOREIGN PATENT DOCUMENTS

| | | |
|---|---|---|
| JP | 2009-042583 | 2/2009 |
| JP | 2009-186797 | 8/2009 |
| JP | 2010-108528 | 5/2010 |
| WO | 2005/015562 | 2/2005 |

* cited by examiner

DECODING DEVICE AND DECODING METHOD

CROSS REFERENCE TO RELATED APPLICATION

This is a continuation application of PCT International Application No. PCT/JP2011/002652 filed on May 12, 2011, designating the United States of America, which is based on and claims priority of Japanese Patent Application No. 2010-212851 filed on Sep. 22, 2010. The entire disclosures of the above-identified applications, including the specifications, drawings and claims are incorporated herein by reference in their entirety.

BACKGROUND (1) Technical Field

The present invention relates to a decoding device and decoding method for performing decoding processing on a file that is read out from an external recording medium.

(2) Description of the Related Art

Conventionally, decoding devices that, when an external recording medium is connected thereto, read out data recorded on the external recording medium and perform decoding processing on the read out data have been developed. For example, the decoding devices perform, as the decoding processing, expansion and reproduction of a compressed music file or compressed image data. Examples of such decoding devices are disclosed in PTL 1 and PTL 2.

For example, the decoding device disclosed in PTL 1 with an external recording medium connected thereto compares new recording medium management information that is newly read out from the external recording medium with previously-acquired recording medium management information that is recorded in an internal storage unit. If the comparison results in a mismatch, the decoding device again acquires file analysis information to be used in decoding processing from the external recording medium. This allows the decoding device disclosed in PTL 1 to reduce the amount of time from insertion of a recording medium to reproduction of the medium.

A content reproduction device (decoding device) disclosed in PTL 2 extracts identification information about a medium device and, when shut down, stores the extracted identification information into a memory. When powered on, the decoding device compares the identification information stored in the memory with the extracted identification information. If the comparison results in a mismatch, the decoding device determines that the medium device that was connected before shutdown is not connected, and outputs warning display. This allows the decoding device to notify a user of whether or not a medium device that was connected before shutdown is properly connected.

CITATION LIST

Patent Literature

[PTL 1] Japanese Unexamined Patent Application Publication No. 2009-186797
[PTL 2] Japanese Unexamined Patent Application Publication No. 2009-42583

SUMMARY

Technical Problem

However, there is a problem with the aforementioned conventional decoding devices in that, when the content of files recorded on an external recording medium has been rewritten, the content of files indicated by the file analysis information stored in the decoding devices does not match the content of files in the external recording medium, and therefore files in the external recording medium cannot properly be reproduced.

For example, when the same external recording medium is connected again after the power supply is once cut off or after the external recording medium is once detached, there are cases in which recording medium management information that is already stored in the internal memory of a decoding device matches recording medium management information that is recorded on the external recording medium, despite the content of files in the external recording medium having been rewritten. Such a situation can happen, for example, when an external recording medium has been detached from a personal computer prior to the completion of the entire operation of rewriting the content of the external recording medium or when a file or folder in an external recording medium has been moved to under another folder without increasing or reducing the numbers of files and folders, because in these cases, the content of the recording medium management information is not rewritten.

In this case, file analysis processing is not executed, and thus a mismatch occurs between the content of files in the external recording medium and the file analysis information stored in the internal memory of the decoding device. In such a situation, there are cases where a content that is specified to be reproduced cannot be reproduced, or the entire content stored in the external recording medium cannot be reproduced.

In view of this, the present invention has been conceived in order to solve the above-described conventional problems, and it is an object of the present invention to, when the content of files recorded on an external recording medium has been rewritten, prevent continuous occurrence of a mismatch between file analysis information stored in the decoding device and the content of files stored in the external recording medium.

Solution to Problem

In order to achieve the above-described object, a decoding device according to an aspect of the present invention includes an interface unit connectable to an external recording medium on which an encoded file and recording medium management information that indicates an attribute of the external recording medium are recorded, a readout unit configured to read out the file and the recording medium management information from the external recording medium when the external recording medium is connected to the interface unit, a decoding unit configured to generate file analysis information that indicates a content of the file read out by the readout unit, through analysis of the content of the file, a storage unit configured to store the file analysis information generated by the decoding unit and the recording medium management information read out by the readout unit, a determination unit configured to determine whether or not new recording medium management information is the same as the recording medium management information stored in the storage unit, the new recording medium management information being newly read out by the readout unit at a given time in a state in which the external recording medium is connected to the interface unit, and a matching confirmation unit configured to perform matching confirmation when the determination unit determines that the new recording medium management information is the same as the recording medium management information stored in the storage unit, the matching confirmation involving determining whether or not a file structure indicated by the file analysis information stored in the storage unit matches a file structure of the file recorded on the external recording medium. The decoding unit is further configured to, when the matching confirmation unit determines that the file structures do not match, newly generate file analysis information through analysis of a content of the file read out by the readout unit and perform decoding processing on the file, using the generated file analysis information; and, when the matching confirmation unit determines that the file structures match, perform decoding processing on the file, using the file analysis information stored in the storage unit.

With this, even if the new recording medium management information matches the recording medium management information stored in the storage unit, despite the content of files in the external recording medium having been rewritten at the time when the external recording medium is connected again to the decoding device, it is possible to prevent continuous occurrence of a mismatch between the content of files in the external recording medium and the file analysis information stored in the storage unit.

Alternatively, the decoding unit may be configured to, when the matching confirmation unit determines that the file structures do not match, analyze the content of the file read out by the readout unit without performing the decoding processing.

With this, it is possible to immediately generate new file analysis information when it is detected that the content of files in the external recording medium and the file analysis information stored in the storage unit do not match. It is thus possible to resolve a mismatch state and prevent the occurrence of an error when a file is reproduced.

Alternatively, the decoding unit may be configured to, when the matching confirmation unit determines that the file structures do not match, at a time at which power supply to the decoding device is to be cut off or at a time at which the external recording medium is detached from the decoding device and again connected to the decoding device, analyze the content of the file read out by the readout unit without the determination by the determination unit.

With this, file analysis is always performed next time when the external recording medium is connected to the interface unit. It is thus possible to prevent the occurrence of an error next time when a file is reproduced.

The decoding device may further include an operation unit configured to output a reproduction request to reproduce the file recorded on the external recording medium, based on an instruction from a user. The matching confirmation unit may be configured to perform the matching confirmation when the reproduction request that is output from the operation unit is received.

With this, the matching confirmation is performed when the reproduction request is received. Thus, it is possible to prevent the reproduction of a file from being performed without being able to detect the fact that the content of files in the external recording medium and the file analysis information stored in the storage unit do not match.

Alternatively, the matching confirmation unit may be configured to determine that the file structures do not match when it is detected that a file other than the content indicated by the file analysis information stored in the storage unit exists in the external recording medium.

With this, it is possible to detect a hidden file.

For example, at least one folder, each including at least zero files, may be stored in the external recording medium, the file analysis information may indicate the number of files for each folder, and the matching confirmation unit may be configured to determine that the file structures do not match when it is detected, for each folder, that n+1 files exist in the external recording medium, n being the number of files indicated by the file analysis information.

Alternatively, the matching confirmation unit may be configured to determine that the file structures do not match when a file name of an n+1th file is acquired from the external recording medium.

Alternatively, the matching confirmation unit may be configured to determine that the file structures do not match when processing for opening an n+1th file is completed.

Alternatively, the matching confirmation unit may be configured not to perform the matching confirmation when the number of files indicated by the file analysis information matches a predetermined number of files.

With this, for example, detecting the absence of a file without performing the matching confirmation is more efficient in confirming the presence or absence of a file, because when the number of files matches a predetermined maximum number of files, it is highly likely that a hidden file will be detected.

Alternatively, at least one folder, each including at least zero folders, may be stored in the external recording medium, the file analysis information may indicate the number of folders for each folder, and the matching confirmation unit may be configured to determine that the file structures do not match when it is detected, for each folder, that m+1 folders exist in the external recording medium, m being the number of folders indicated by the file analysis information.

With this, it is possible to detect a hidden folder.

For example, the matching confirmation unit may be configured to determine that the file structures do not match when a folder name of an m+1th folder is acquired from the external recording medium.

Alternatively, the matching confirmation unit may be configured to determine that the file structures do not match when processing for opening an m+1th folder is completed.

Alternatively, the matching confirmation unit may be configured not to perform the matching confirmation when the number of folders indicated by the file analysis information matches a predetermined number of folders.

With this, for example, detecting the absence of a file without performing the matching confirmation is more efficient in confirming the presence or absence of a file, because when the number of folders matches a predetermined maximum number of folders, it is highly likely that a hidden folder will be detected.

Alternatively, the matching confirmation unit may be configured to determine that the file structures do not match when it is detected that part of the content indicated by the file analysis information stored in the storage unit does not exist in the external recording medium.

With this, it is possible to detect that the file indicated by the file analysis information does not exist in the external recording medium, i.e., the absence of a file.

For example, at least one folder, each including at least zero files, may be stored in the external recording medium, and the matching confirmation unit may be configured to determine that the file structures do not match when a file or a folder indicated by the file analysis information stored in the storage unit is not read out.

Alternatively, the matching confirmation unit may be configured to determine that the file structures do not match when a file name of a file indicated by the file analysis information is acquired.

Alternatively, the matching confirmation unit may be configured to determine that the file structures do not match when processing for opening a file indicated by the file analysis information is not able to be completed.

Alternatively, the matching confirmation unit may be configured to, for every file indicated by the file analysis information, confirm whether or not the file exists in the external recording medium.

With this, it is possible to, for every file, confirm whether or not the file is recorded on the external recording medium. Thus, the presence or absence of every file can be reliably detected.

Alternatively, the matching confirmation unit may be configured to, for every folder indicated by the file analysis information, confirm whether or not the folder exists in the external recording medium.

With this, it is possible to, for every folder, confirm whether or not the folder is recorded on the external recording medium. Thus, the presence or absence of every folder can be reliably detected.

The decoding device may further include an operation unit configured to output a reproduction request to reproduce a file recorded on the external recording medium, based on an instruction from a user. The matching confirmation unit may be configured to perform the matching confirmation on a file indicated by the reproduction request that is output from the operation unit.

With this, the presence or absence of only a file that is requested to be reproduced is confirmed. Thus, it is possible to minimize confirmation processing and reduce the amount processing.

The decoding device may further include an operation unit configured to output a special reproduction request to make a special reproduction of a file recorded on the external recording medium, based on an instruction from a user. The matching confirmation unit may be configured to stop the matching confirmation when the special reproduction request is received from the operation unit.

With this, the matching confirmation is stopped when the amount of processing required for special reproduction increases. It is thus possible to reduce the load on the decoding device.

Note that the present invention can be realized as not only a decoding device, but also a method in which the processing units of the decoding device are regarded as steps. For example, a decoding method according to an aspect of the present invention includes reading out an encoded file and recording medium management information that indicates an attribute of the external recording medium from an external recording medium and storing the read out recording medium management information into a storage unit, when the external recording medium on which the file and the recording medium management information are recorded is connected to an interface unit connectable to the external recording medium, generating file analysis information that indicates a content of the file read out in the reading out, through analysis of the content of the file, and storing the generated file analysis information into the storage unit, determining whether or not new recording medium management information is the same as the recording medium management information stored in the storage unit, the new recording medium management information being newly read out at a given time in a state in which the external recording medium is connected to the interface unit, and when it is determined in the determining that the new recording medium management information is the same as the recording medium management information stored in the storage unit, performing matching confirmation that involves determining whether or not a file structure indicated by the file analysis information stored in the storage unit matches a file structure of the file recorded on the external recording medium. In the decoding, when it is determined in the matching confirming that the file structures do not match, new file analysis information is generated through analysis of a content of a file that is newly read out, and decoding processing is performed on the file, using the generated file analysis information, and when it is determined in the matching confirming that the file structures match, decoding processing is performed on the file, using the file analysis information stored in the storage unit.

With this, even if the new recording medium management information matches the recording medium management information stored in the storage unit, despite the content of files in the external recording medium having been rewritten at the time when the external recording medium is connected again to the decoding device, it is possible to prevent continuous occurrence of a mismatch between the content of files in the external recording medium and the file analysis information stored in the storage unit.

Advantageous Effects

As described above, when the content of files in an external recording medium has been rewritten, the decoding device according to the present invention can prevent continuous occurrence of a mismatch between the file analysis information stored in the decoding device and the content of files stored in the external recording medium.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Embodiment 1

A decoding device according to Embodiment 1 of the present invention includes an interface unit, a readout unit configured to read out an encoded file and recording medium management information from an external recording medium, a decoding unit configured to analyze the read out file, a storage unit configured to store the file analysis information and the recording medium management information, a determination unit configured to determine whether or not two pieces of recording medium management information are the same in a state in which the external recording medium is connected to the interface unit, and a matching confirmation unit configured to, when it is determined that the pieces of recording medium management information are the same, determine whether or not a file structure indicated by the file analysis information stored in the storage unit matches a file structure of the file recorded on the external recording medium. The decoding unit is further configured to, when the matching confirmation unit determines that the file structures do not match, newly generate file analysis information and perform decoding processing on the file, using the generated file analysis information, and when the matching confirmation unit determines that the file structures match, perform decoding processing on the file, using the file analysis information stored in the storage unit.

Figure 1:
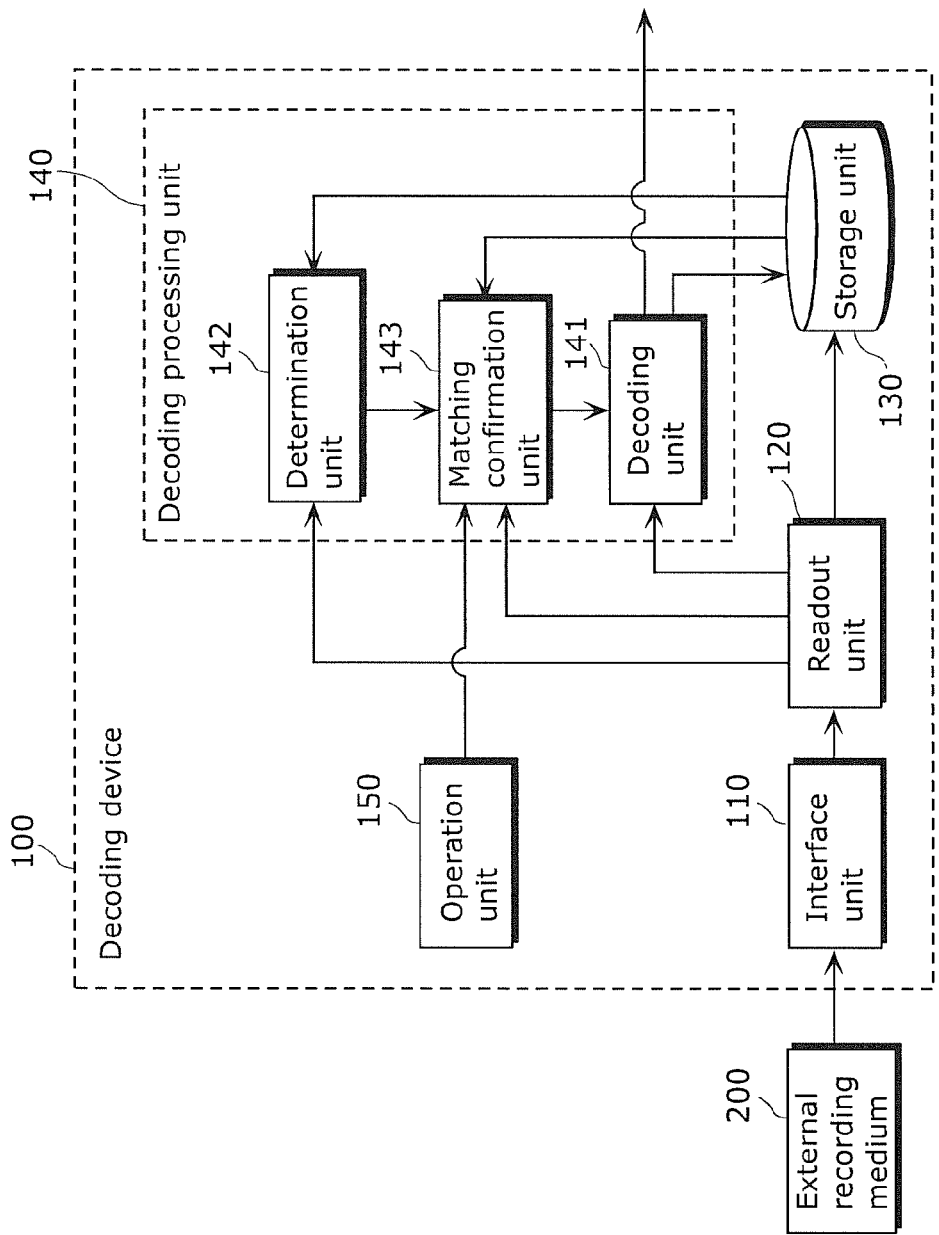
FIG. 1 is a functional block diagram showing an example of a configuration of a decoding device according to Embodiment 1 of the present invention.

FIG. 1 is a functional block diagram showing an example of a configuration of a decoding device 100 according to Embodiment 1 of the present invention. The decoding device 100 decodes files stored in an external recording medium 200 and reproduces the content of the decoded files.

The external recording medium 200 is a recording medium on which encoded files and recording medium management information are recorded. The external recording medium 200 is, for example, a recording medium such as a magnetic disk, an optical disk, or a flash memory, examples of which include a universal serial bus (USB) memory, a memory card, and a Blu-ray disc (BD).

The encoded files include, for example, a content obtained by encoding audio data, video data, or the like based on a predetermined standard. For example, a single file corresponds to a single piece of audio content (e.g., a single piece of music).

The external recording medium 200 stores, for example, at least one folder. Each folder includes at least zero file and at least zero folder. Note that "storing folders" as used here refers to storing information for classifying files or the like stored in the external recording medium 200 into units of predetermined groups.

The recording medium management information is information that indicates the attribute of the external recording medium 200. The recording medium management information includes, for example, recording medium identification information and file rewriting identification information.

The recording medium identification information is information that is attached to and recorded on each recording medium in order to individually identify each recording medium (e.g., "device ID" and "product ID"). Note that the "identification of recording media" as used here refers to processing for individually identifying each recording medium.

The file rewriting identification information is information that changes when a recording content in one recording medium is rewritten (e.g., "free space," "rewritten date and time," "physical locations of folders and files"). Note that the "file rewriting identification" as used here refers to processing for identifying whether or not the recording content in one recording medium has been rewritten.

As illustrated in FIG. 1, the decoding device 100 according to Embodiment 1 of the present invention includes an interface unit 110, a readout unit 120, a storage unit 130, a decoding processing unit 140, and an operation unit 150.

The interface unit 110 is an interface to which the external recording medium 200 can be connected. For example, the interface unit 110 is a USB terminal or the like.

The readout unit 120 reads out files and the recording medium management information from the external recording medium 200 when the external recording medium 200 is connected to the interface unit 110. The readout unit 120 stores the read out recording medium management information into the storage unit 130.

The storage unit 130 is a memory for storing file analysis information and the recording medium management information. The file analysis information is information indicating a content of files and is generated by the decoding processing unit 140.

The decoding processing unit 140 performs decoding processing and reproduction processing on the files read out from the external recording medium 200. As illustrated in FIG. 1, the decoding processing unit 140 includes a decoding unit 141, a determination unit 142, and a matching confirmation unit 143.

The decoding unit 141 generates file analysis information that indicates the content of the files read out by the readout unit 120, through analysis of the content of the files. The decoding unit 141 also stores the generated file analysis information into the storage unit 130.

Note that the decoding unit 141 analyzes the content of the files based on the result of the determination performed by the determination unit 142 and the result of the matching confirmation performed by the matching confirmation unit 143. Specifically, if the determination unit 142 has determined that the content of files is to be newly analyzed, the decoding unit 141 generates new file analysis information through analysis of the content of the read out files. Also, if the matching confirmation unit 143 has determined that the file structures do not match, the decoding unit 141 generates new file analysis information through analysis of the content of the read out files.

Note that the file analysis information is information that indicates the content of files and folders. For example, the file analysis information indicates the number of files in each folder and the number of folders in each folder. The file analysis information may also indicate, for example, the file name, size, generated date and time, and updated date and time of each file and the folder name, size, generated date and time, and updated date and time of each folder.

If the matching confirmation unit 143 has determined that the file structures do not match, the decoding unit 141 performs file decoding processing, using the generated file analysis information. If the matching confirmation unit 143 has determined that the file structures match, the decoding unit 141 performs file decoding processing, using the file analysis information stored in the storage unit 130.

The determination unit 142 determines whether or not the recording medium management information that is newly read out by the readout unit 120 at a given time in a state in which the external recording medium 200 is connected to the interface unit 110 (hereinafter, also referred to as the "new recording medium management information") is the same as the recording medium management information stored in the storage unit 130 (hereinafter, also referred to as the "previously-acquired recording medium management information"). Specifically, the determination unit 142 determines whether or not the file analysis information stored in the storage unit 130 is to be used in the file decoding processing, by comparing the new recording medium management information and the previously-acquired recording medium management information.

Specifically, if the new recording medium management information is the same as the previously-acquired recording medium management information, the determination unit 142 determines that the file analysis information stored in the storage unit 130 is to be used. On the other hand, if the new recording medium management information is not the same as the previously-acquired recording medium management information, the determination unit 142 determines to newly analyze a content of files.

If the determination unit 142 has determined that the new recording medium management information is the same as the previously-acquired recording medium management information, that is, when it has been determined that the file analysis information stored in the storage unit 130 is to be used, the matching confirmation unit 143 performs matching confirmation. The "matching confirmation" as used here refers to processing for determining whether or not the file structure indicated by the file analysis information stored in the storage unit 130 matches the file structure of files stored in the external recording medium 200. Specific operations performed by the matching confirmation unit 143 will be described later.

The operation unit 150 outputs a reproduction request to reproduce a file recorded on the external recording medium 200, based on an instruction from a user. Specifically, as illustrated in FIG. 1, the operation unit 150 outputs a reproduction request to the matching confirmation unit 143. Upon receiving the reproduction request that is output from the operation unit 150, the matching confirmation unit 143 performs matching confirmation.

The above has been an example of the functional configuration of the decoding device 100 according to Embodiment 1 of the present invention. Next is a description of a hardware configuration for realizing the above-described functional configuration.

Figure 2:
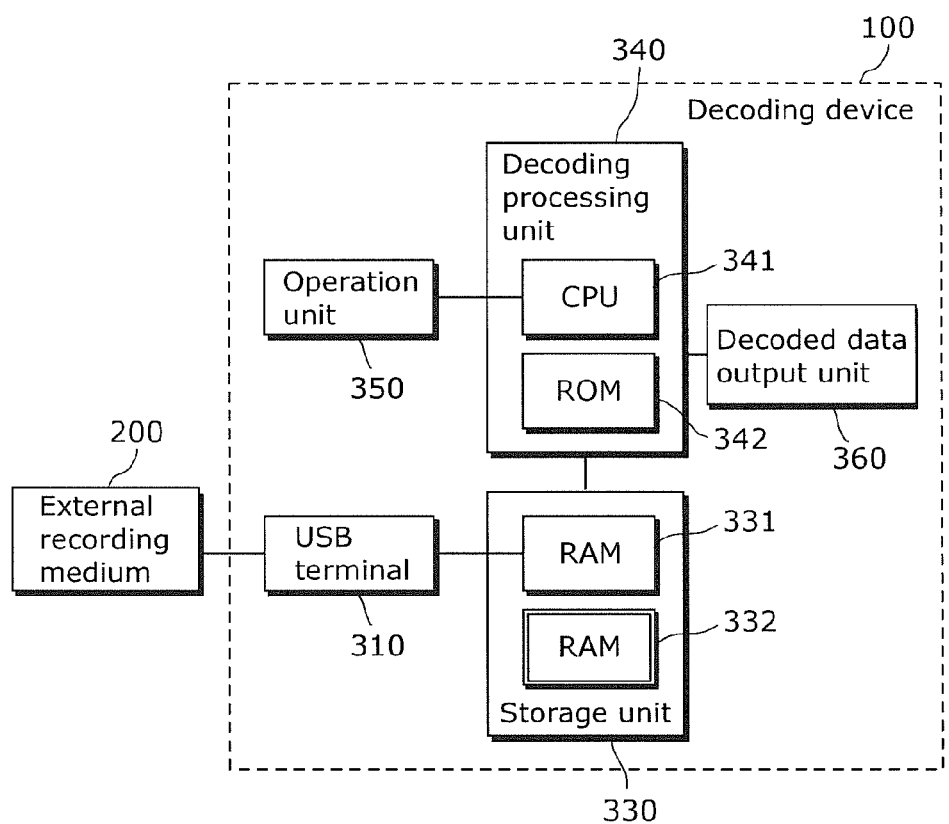
FIG. 2 shows an example of a hardware configuration of the decoding device according to Embodiment 1 of the present invention.

FIG. 2 shows an example of a hardware configuration of the decoding device 100 according to Embodiment 1 of the present invention. As illustrated in FIG. 2, the decoding device 100 according to Embodiment 1 of the present invention includes a USB terminal 310 (interface unit), a storage unit 330, a decoding processing unit 340, an operation unit 350, and a decoded data output unit 360.

The USB terminal 310 corresponds to the interface unit 110 and the readout unit 120 illustrated in FIG. 1. Note that the decoding device 100 may include, instead of the USB terminal 310, an optical drive for use in reading an optical disk or a card slot for use in reading a memory card.

The storage unit 330 corresponds to the storage unit 130 illustrated in FIG. 1. As illustrated in FIG. 2, the storage unit 330 includes random access memories (RAMs) 331 and 332. The RAM 331 is a volatile memory. The RAM 332 is a nonvolatile memory capable of holding data even during power off, such as an electrically erasable programmable read only memory (EEPROM).

The decoding processing unit 340 corresponds to the decoding processing unit 140 illustrated in FIG. 1. As illustrated in FIG. 2, the decoding processing unit 340 includes a central processing unit (CPU) 341 and a ROM 342.

The ROM 342 stores programs for the CPU 341 executing the functions of the decoding unit 141, the determination unit 142, and the matching confirmation unit 143 illustrated in FIG. 1. The CPU 341 realizes the functions of the decoding unit 141, the determination unit 142, and the matching confirmation unit 143 by reading out the respective programs from the ROM 342 and executing these programs.

The operation unit 350 corresponds to the operation unit 150 illustrated in FIG. 1, an example of which is a user interface that receives an instruction from a user. Examples of the operation unit 350 include an operation panel and a touch panel.

The decoded data output unit 360 outputs the content of files decoded by the decoding processing unit 340. Examples of the decoded data output unit 360 include a speaker and a display that output audio and video. Alternatively, the decoded data output unit 360 may be an interface for use in connection to an external speaker and an external display.

Figure 3:
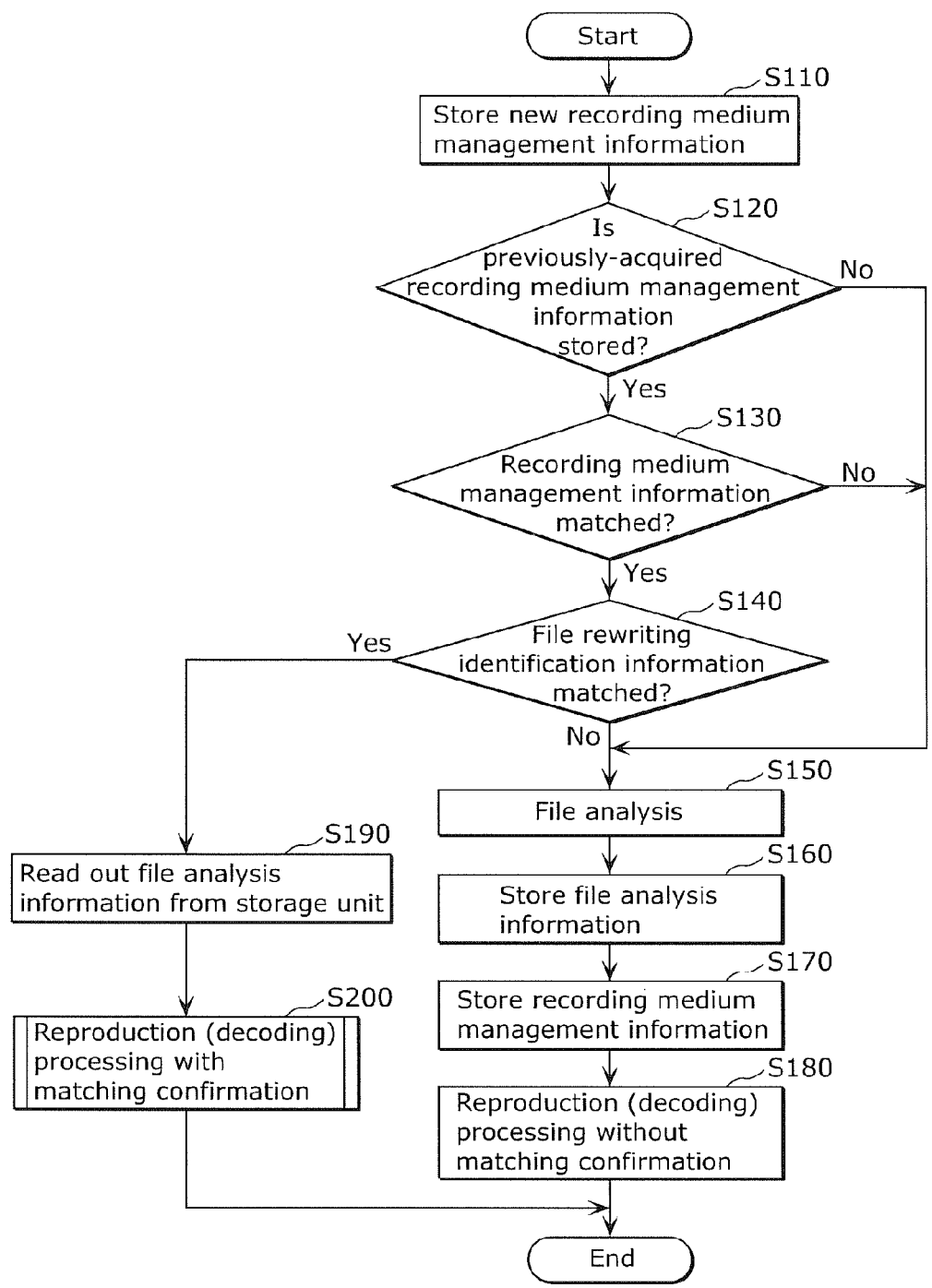
FIG. 3 is a flowchart showing an example of operations performed by the decoding device according to Embodiment 1 of the present invention.

Hereinafter, an example of the operations performed by the decoding device 100 according to Embodiment 1 of the present invention will be described with reference to FIGS. 3 and 4. FIG. 3 is a flowchart showing an example of the operations performed by the decoding device 100 according to Embodiment 1 of the present invention.

First, when the external recording medium 200 is connected to the USB terminal 310, the recording medium management information recorded on the external recording medium 200 is read out and stored into the RAM 331 (S110). In other words, when the external recording medium 200 is connected to the interface unit 110, the readout unit 120 reads out the recording medium management information from the external recording medium 200 and stores the read out recording medium management information into the storage unit 130.

Next, it is determined whether or not previously-acquired recording medium management information (specifically, recording medium identification information and file rewriting identification information at the time of the previous connection) is stored in the storage unit 330 (specifically, RAM 332) (S120). In other words, the determination unit 142 determines whether or not previously-acquired recording medium management information is stored in the storage unit 130.

If it has been determined that previously-acquired recording medium management information is not stored in the RAM 332 (No in S120), the procedure proceeds to file analysis processing (S150). In other words, when the determination unit 142 has determined that previously-acquired recording medium management information is not stored in the storage unit 130, the decoding unit 141 analyzes a content of the files read out from the currently connected external recording medium 200 (S150). The decoding unit 141 then stores file analysis information that indicates the result of the analysis processing into the storage unit 130 (S160). At this time, the file analysis information is stored into the RAM 332.

Furthermore, the recording medium management information (specifically, recording medium identification information and file rewriting identification information) read out from the external recording medium 200 is stored into the storage unit 330 (RAM 332) (S170). In other words, the readout unit 120 reads out the recording medium management information from the external recording medium 200 and stores the read out recording medium management information into the storage unit 130.

Note that the file analysis information and the recording medium management information are stored in the RAM 332, which is a nonvolatile memory. Accordingly, even if the power supply to the decoding device 100 is cut off, the file analysis information and the recording medium management information remains stored without being lost.

Lastly, the decoding unit 141 performs decoding (content reproduction) of the files recorded on the external recording medium 200 (S180). At this time, because the file analysis has already been performed and there is guarantee that the content indicated by the file analysis information matches the content of the files recorded on the external recording medium 200, the matching confirmation unit 143 does not need to perform matching confirmation.

If the power supply to the decoding device 100 is cut off after the execution of the above-described processing, although the information recorded in the RAM 331 is lost, the information stored in the RAM 332 is preserved. Then, when the power is again supplied to the decoding device 100 and the operation unit 350 has issued a "reproduction instruction", the decoding processing unit 340 reads out the recording medium management information (recording medium identification information and file rewriting identification information) recorded on the external recording medium 200 from the external recording medium 200 (S110). Thereafter, it is determined whether or not previously-acquired recording medium management information (recording medium identification information and file rewriting identification information at the time of the previous connection) and previously-acquired file analysis information (file analysis information obtained through analysis at the time of the previous connection) are stored in the RAM 332 (S120).

If it has been confirmed that the previously-acquired recording medium management information and the previously-acquired file analysis information are stored (Yes in step S120), then it is determined whether or not the content indicated by the new recording medium management information (recording medium identification information and file rewriting identification information) read out in step S110 is the same as the content indicated by the previously-acquired recording medium management information stored in the RAM 332 (S130 and S140). Specifically, the determination unit 142 determines whether or not the new recording medium identification information matches the previously-acquired recording medium identification information (S130). If they do not match (No in step S130), the decoding unit 141 analyzes the content of the files recorded on the currently connected external recording medium 200 (S150).

If the new recording medium identification information matches the previously-acquired recording medium identification information (Yes in step S130), then the determination unit 142 determines whether or not the new file rewriting identification information matches the previously-acquired rewriting identification information (S140). If they do not match (No in step S140), the decoding unit 141 analyzes the content of the files recorded on the currently connected external recording medium 200 (S150).

If the new file rewriting identification information matches the previously-acquired file rewriting identification information (Yes in step S140), the decoding unit 141 reads out the file analysis information stored in the storage unit 130 (S190). Then, the decoding unit 141 performs reproduction processing with matching confirmation (S200).

A feature of the decoding device 100 according to Embodiment 1 of the present invention is that it is confirmed whether or not the content of files recorded on the external recording medium 200 matches the content indicated by the file analysis information stored in the storage unit 130. That is, when it is determined that the file analysis information stored in the storage unit 130 is usable, the decoding device 100 according to Embodiment 1 of the present invention determines whether or not that file analysis information precisely represents the content of files recorded on the external recording medium 200.

Figure 4:
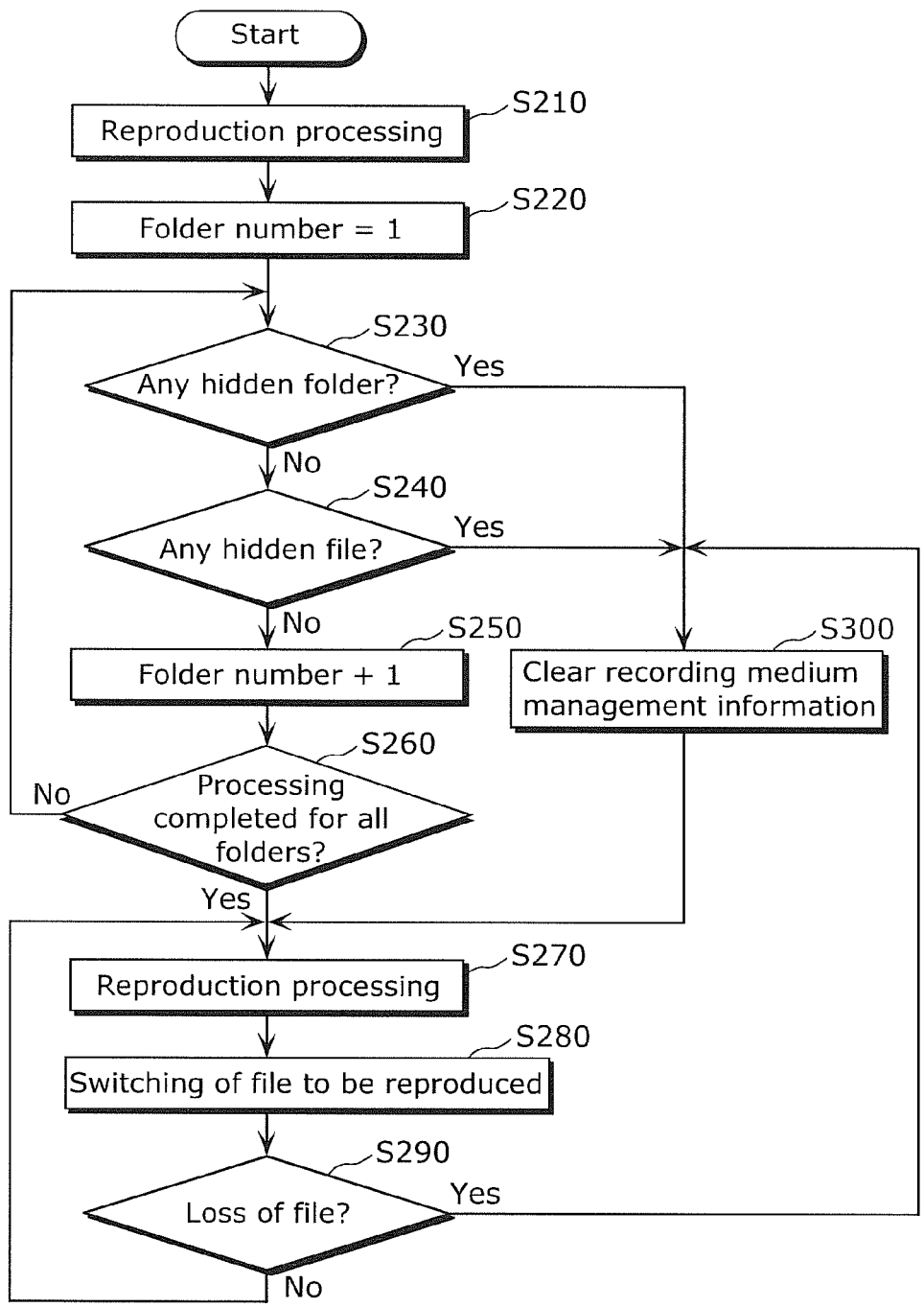
FIG. 4 is a flowchart showing an example of matching confirmation processing according to Embodiment 1 of the present invention.

FIG. 4 is a flowchart showing an example of the matching confirmation processing according to Embodiment 1 of the present invention.

First, the decoding unit 141 performs reproduction processing when a reproduction request is received from the operation unit 150 (S210). In other words, the decoding unit 141 decodes files read out from the external recording medium 200. Note that matching confirmation is performed when the reproduction request is received, and thus it is possible to prevent the reproduction from being performed without detecting that the content of files in the external recording medium 200 does not match the file analysis information stored in the storage unit 130.

In order to perform the matching confirmation, the matching confirmation unit 143 first initially sets the folder number of a folder to be analyzed (target folder) to "1" (S220). The matching confirmation unit 143 then determines the presence or absence of a hidden folder in the target folder (S230).

Specifically, the matching confirmation unit 143 reads out "information indicating the number of folders in the first folder", the information being obtained from the file analysis information read out from the storage unit 130 (RAM 332). For example, if the information indicates a value of "15," the matching confirmation unit 143 attempts to acquire the folder name of the sixteenth folder. In other words, the matching confirmation unit 143 attempts to acquire the folder name of the m+1th folder, where m is the number of folders in the target folder indicated by the file analysis information.

At this time, if there is no hidden folder (the file analysis information matches the content of files in the external recording medium 200) (No in step S230), the folder name of the m+1th folder cannot be acquired, and an error is transmitted as a reply. On the other hand, if the folder name of the m+1th folder can be acquired, it means that a folder that should not exist has been found, that is, a hidden folder exists (Yes in step S230). In this case, the "rewriting of the files has occurred." Thus, in this case, the matching confirmation unit 143 clears the recording medium management information (recording medium identification information and file rewriting identification information) (S300).

As a result, next time when the matching confirmation is performed on the recording medium identification information and the file rewriting identification information in steps S120 to S140, the file analysis processing is certainly to be executed (S150). Accordingly, file analysis is certainly performed next time when the external recording medium 200 is connected to the interface unit 110, and therefore it is possible to prevent the occurrence of an error next time when files are to be reproduced.

Following the determination of the presence or absence of a hidden folder, the matching confirmation unit 143 next determines the presence or absence of a hidden file (S240). Specifically, the matching confirmation unit 143 reads out "information indicating the number of files in the first folder", the information being obtained from the file analysis information. For example, if the information indicates a value of 27, the matching confirmation unit 143 attempts to acquire the file name of the 28th file. Specifically, the matching confirmation unit 143 attempts to acquire the file name of an n+1th file, where n is the number of files in the target folder indicated by the file analysis information.

At this time, if there is no hidden file (the file analysis information matches the content of files in the external recording medium 200) (No in step S240), the file name of the 28th file cannot be acquired, and an error is transmitted as a reply. On the other hand, if the file name of the 28th file can be acquired, it means that a file that should not exist has been found, that is, a hidden file exists (Yes in step S240). In this case, the "rewriting of the files has occurred." Accordingly, in this case as well, the matching confirmation unit 143 performs processing for clearing the recording medium management information as described above (S300).

Then, the matching confirmation unit 143 sequentially increments the folder number by one (S250) and repeats the above-described processing until the searches for hidden folders and hidden files are completed for all the folders. In this way, for each folder, the matching confirmation unit 143 determines that the file structures do not match when it is detected that (m+1) folders exist in the external recording medium 200, where m is the number of folders indicated by the file analysis information. Specifically, the matching confirmation unit 143 determines that the file structures do not match when the folder name of the m+1th folder can be acquired.

Similarly, for each folder, the matching confirmation unit 143 determines that the file structures do not match when it is determined that n+1 files exist in the external recording medium 200, where n is the number of files indicated by the file analysis information. Specifically, the matching confirmation unit 143 determines that the file structures do not match when the file name of the n+1th file can be acquired. Through this, it is possible to confirm the presence or absence of folders and files other than all the folders and all the files recorded in the previously-acquired file analysis information.

Next, after the searches are completed for all the folders, the decoding unit 141 reproduces a file (e.g., audio content) designated by the operation unit 150 (operation unit 350) (S270). In this case, all the files are not searched for the presence or absence of the designated file in order to avoid the occurrence of a problem such as a sound skip due to extra load being applied to the decoding device.

Specifically, when the procedure proceeds to normal reproduction processing (S270), the decoding processing unit 140 performs "loss-of-file detection" on only the file designated to be reproduced by the operation unit 150. To be more specific, the matching confirmation unit 143 receives a reproduction request to reproduce a specific file from the operation unit 150 (S280). That is, the reproduction request indicates at least one file to be reproduced.

Then, the matching confirmation unit 143 confirms whether or not it is possible to read out the file indicated by the received reproduction request. In other words, the matching confirmation unit 143 confirms the presence or absence of the file indicated by the reproduction request in the external recording medium 200 (S290).

Specifically, the matching confirmation unit 143 determines that the target file is lost (Yes in step S290) if processing for opening the target file cannot be completed or the file name of the target file cannot be acquired. Specifically, when the target file does not exist in the external recording medium 200, the matching confirmation unit 143 determines that the file structure indicated by the file analysis information does not match the file structure of files recorded on the external recording medium 200.

Then, the matching confirmation unit 143 clears the recording medium identification information and the file rewriting identification information so that file analysis processing is definitely performed next time (S300).

As described above, in a state in which the external recording medium 200 is connected to the interface unit 110, the decoding device 100 according to Embodiment 1 of the present invention determines whether or not the new recording medium management information is the same as the previously-acquired recording medium management information. If it has been determined that the new recording medium management information is the same as the previously-acquired recording medium management information, the decoding device 100 determines whether or not the content indicated by the previously-acquired file analysis information matches the content of files in the external recording medium 200. The decoding device 100 generates new file analysis information when the matching confirmation processing results in a mismatch.

As a result, in contrast to the conventional case in which the detection of rewriting of files may not be possible by the comparison of the recording medium management information, the decoding device 100 according to this embodiment is capable of precisely detecting the occurrence of rewriting of files because it performs matching confirmation of the file content. That is, when the file content in the external recording medium 200 is rewritten, it is possible to prevent continuous occurrence of a mismatch between the file analysis information stored in the decoding device 100 and the content of files stored in the external recording medium 200.

Note that in the "loss-of-file detection" (steps S270 to 290), the matching confirmation unit 143 may confirm the presence or absence of all the files recorded in the previously-acquired file analysis information regardless of the reproduction request from the operation unit 150, unlike the above-described embodiment. In other words, the matching confirmation unit 143 may determine that the file structures do not match when the file names of the files indicated by the previously-acquired file analysis information can be acquired. Alternatively, the matching confirmation unit 143 may determine that the file structures do not match when the processing for opening the files indicated by the previously-acquired file analysis information cannot be completed. Note that this processing is performed for each file.

Also, the matching confirmation unit 143 may confirm the presence or absence of all the folders recorded in the previously-acquired file analysis information, regardless of the reproduction request from the operation unit 150. In other words, the matching confirmation unit 143 may determine that the file structures do not match when the folder names of the folders indicated by the previously-acquired file analysis information can be acquired. Alternatively, the matching confirmation unit 143 may determine that the file structures do not match when the processing for opening the folders indicated by the previously-acquired file analysis information cannot be completed. Note that this processing is performed for each folder.

Figure 5:
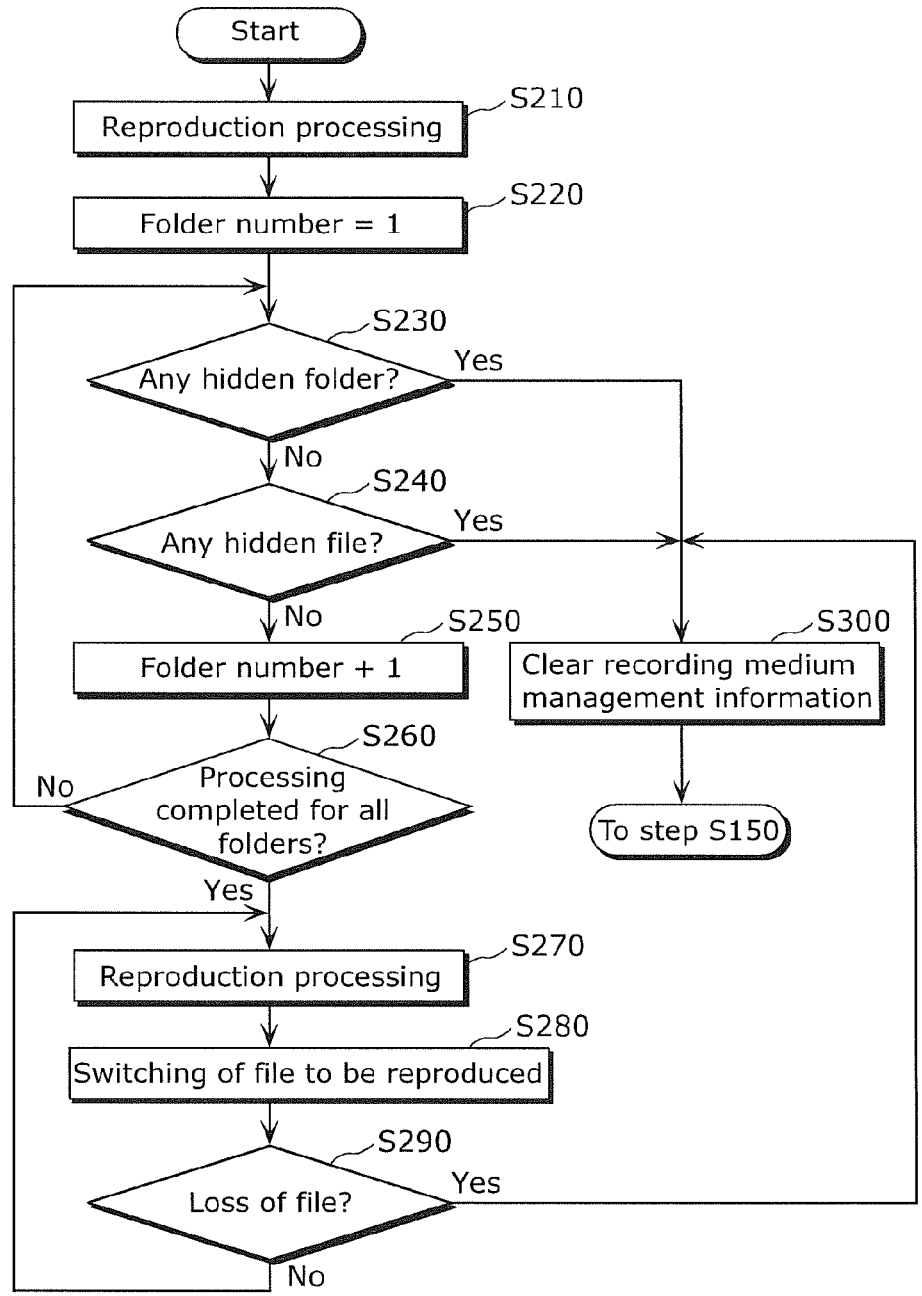
FIG. 5 is a flowchart showing another example of the matching confirmation processing according to Embodiment 1 of the present invention.

In the example of FIG. 4, a case is described in which even if the "rewiring of files," i.e., "mismatch", has been detected, file analysis is not immediately performed, and when the power supply to the entire decoding device 100 is cut off or when the external recording medium 200 is once detached from the decoding device 100 and again connected to the decoding device 100, file analysis is executed. However, as illustrated in FIG. 5, file analysis may be immediately re-executed in a similar manner at a time when the "rewiring of files" has been detected in step S230, S240, or S290.

In this way, new file analysis information can be immediately generated when it is detected that the content of files in the external recording medium does not match the file analysis information recorded in the storage unit. Accordingly, it is possible to resolve a mismatch state and prevent the occurrence of an error when a file is reproduced.

While the above embodiment describes an example involving reading out the file name for the "search for hidden files," similar search can also be executed by determining whether or not processing for opening a file can be completed. Specifically, the matching confirmation unit 143 attempts to perform processing for opening the n+1th file, where n is the number of files indicated by the previously-acquired file analysis information, and determines that the file structures do not match when the processing for opening that file is completed.

Similarly, while the above embodiment describes an example involving reading out the folder name for the "search for hidden folders," similar search can also be conducted by determining whether or not processing for opening a folder can be completed. Specifically, the matching confirmation unit 143 attempts to perform processing for opening the m+1th folder, where m is the number of folders indicated by the previously-acquired file analysis information, and determines that the file structures do not match when the processing for opening that folder is completed.

The above embodiment describes a case in which the processing for the "search for hidden files" is performed simultaneously upon receipt of the reproduction request from the operation unit 150. However, in the case where the operation unit 150 issues not a reproduction request but a request for processing that requires the readout and decoding of file data and the making of sound within a short period of time (e.g., a request for special reproduction such as fast-forwarding or fast-rewinding), simultaneously execution of the "search for hidden files" may cause a sound skip in the reproduced audio. Accordingly, in the case of such an operation mode, it is also possible to avoid the occurrence of a sound skip by temporarily stopping the "search for hidden files." This is not only limited to the case of special reproduction, and the matching confirmation may be stopped in the case where a reduction in the processing load on the device is required.

Furthermore, in order to reduce the processing load on the device, search processing for each individual folder may be dispersed so that the matching confirmation of the file content can be performed in parallel with processing for outputting audio from the decoded data output unit 360.

Embodiment 2

A feature of the decoding device according to Embodiment 2 of the present invention is that when the number of files indicated by the previously-acquired file analysis information matches a predetermined number of files or when the number of folders indicated by the previously-acquired file analysis information matches a predetermined number of folders, the matching confirmation is not performed. Note that the configuration of the decoding device according to Embodiment 2 of the present invention is the same as that of the decoding device 100 illustrated in FIG. 1, and descriptions thereof will be omitted from the following description.

A "predetermined number of files" as used here refers to, for example, a maximum number of files that the decoding device 100 according to Embodiment 2 can analyze (hereinafter, referred to as the "maximum analyzable number of files"). Also, a "predetermined number of folders" as used here refers to, for example, a maximum number of folders that the decoding device 100 can analyze (hereinafter, referred to as the "maximum analyzable number of folders).

Figure 6:
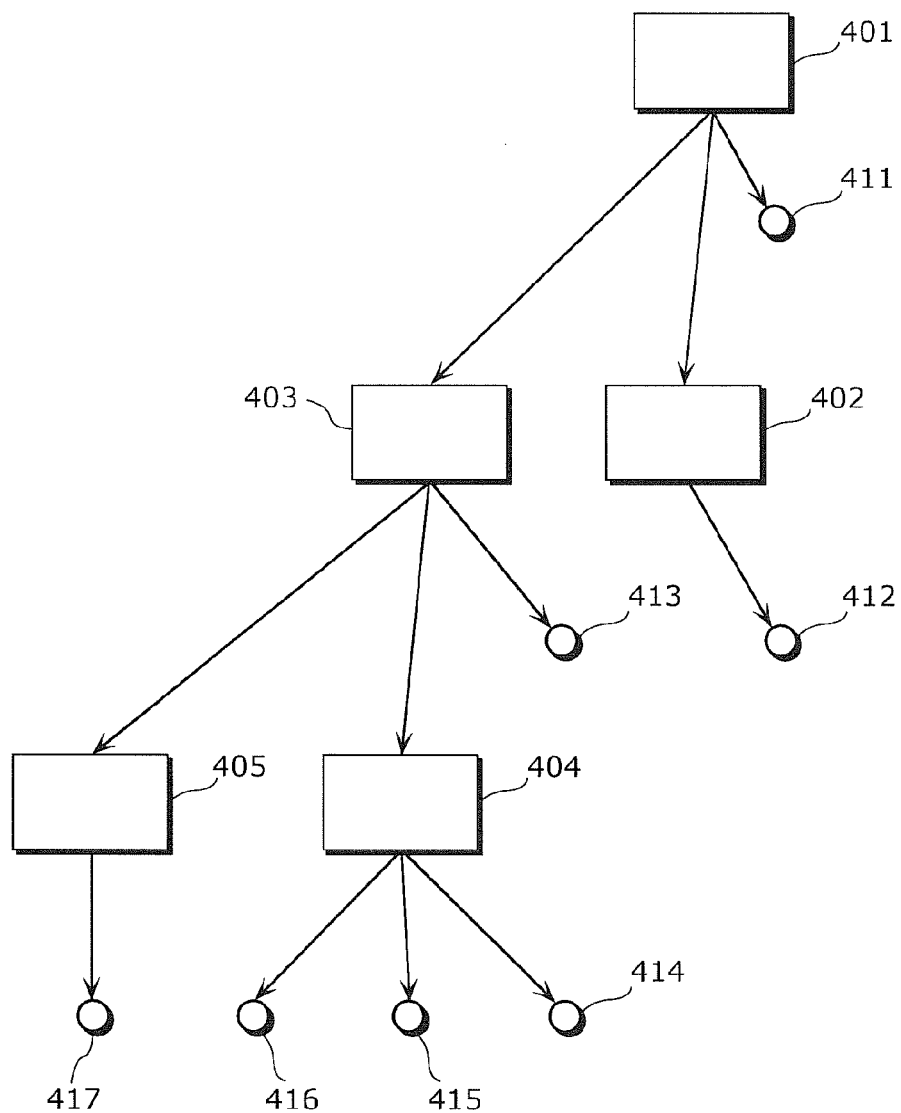
FIG. 6 shows an example of a file structure according to Embodiment 2 of the present invention.

FIG. 6 shows an example of a file structure according to Embodiment 2 of the present invention. As illustrated in FIG. 6, folders 401 to 405 and files 411 to 417 are stored in the external recording medium 200. The external recording medium 200 has a hierarchical structure formed of a plurality of folders with the folder 401 as a top-level folder. The second embodiment will be described using a case where the "maximum analyzable number of files" is "5" when the external recording medium 200 is analyzed, as an example.

The matching confirmation unit 143 sequentially reads out an entry in each folder, starting with the folder 401. The "entry" as used here refers to a folder or file included in the target folder. When the type of the entry is "file," the matching confirmation unit 143 updates both the number of files in the folder being analyzed, and the total number of files. When the type of the entry is "folder," the matching confirmation unit 143 opens that folder and further moves to a lower-level folder.

In the example of FIG. 6, the matching confirmation unit 143 first opens the folder 401 and reads out the file 411, which is the first entry in the folder. Then, the folder 402 is read out as the next entry, so the matching confirmation unit 143 opens the folder 402 and reads out the file 412 in the folder.

Thereafter, through a similar procedure, the matching confirmation unit 143 opens the folders 403 and 404 in the order specified and sequentially reads out the files 413, 414, and 415. At this time, since the "maximum analyzable number of files" is "5," file analysis processing is completed at a time when the file 415 is read out as entry information.

In this case, the file 416 exists in the folder 404, but the file analysis information to be written into the storage unit 130 (RAM 332) does not indicate the presence of the file 416. The same applies to the folder 405 and the file 417.

In this condition, for example, if the power supply to the entire decoding device 100 is cut off or if the external recording medium 200 is once detached from the decoding device 100 and again connected to the decoding device 100, the determination in step S140 in FIG. 3 will result in a "match" because the content of the external recording medium 200 is not rewritten, and the processing of step S190 onward will be performed. Eventually, a hidden folder 405 will be detected in step S230 in FIG. 4, or a hidden file 416 will be detected in step S240.

A case where the number of folders indicated by the previously-acquired file analysis information matches the predetermined "maximum analyzable number of folders" will be further described with reference to FIG. 6. For example, a case where the "maximum analyzable number of folders" is "4" is given as an example.

In the example of FIG. 6, first the folder 401 is opened and the file 411, which is the first entry in that folder, is read out. Thereafter, the folder 402 is read out as the next entry. Thus, the matching confirmation unit 143 opens the folder 402 and reads out the file 412 in the folder.

Thereafter, through a similar procedure, the matching confirmation unit 143 opens the folders 403 and 404 in the order specified and sequentially reads out the files 413, 414, 415, and 416. At this time, since the "maximum analyzable number of folders" is "4," file analysis processing is completed at a time when all the files in the folder 404 are read out.

In this case, the folder 405 exists in the folder 403, but the file analysis information to be written into the storage unit 130 (RAM 332) does not indicate the presence of the folder 405.

In this condition, for example, if the power supply to the entire decoding device 100 is cut off or if the external recording medium 200 is once detached from the decoding device 100 and again connected to the decoding device 100, the determination in step S140 in FIG. 3 will result in a "match" and the processing of step S190 onward will be performed. Eventually, a hidden folder 405 will be detected in step S230 in FIG. 4.

Figure 7:
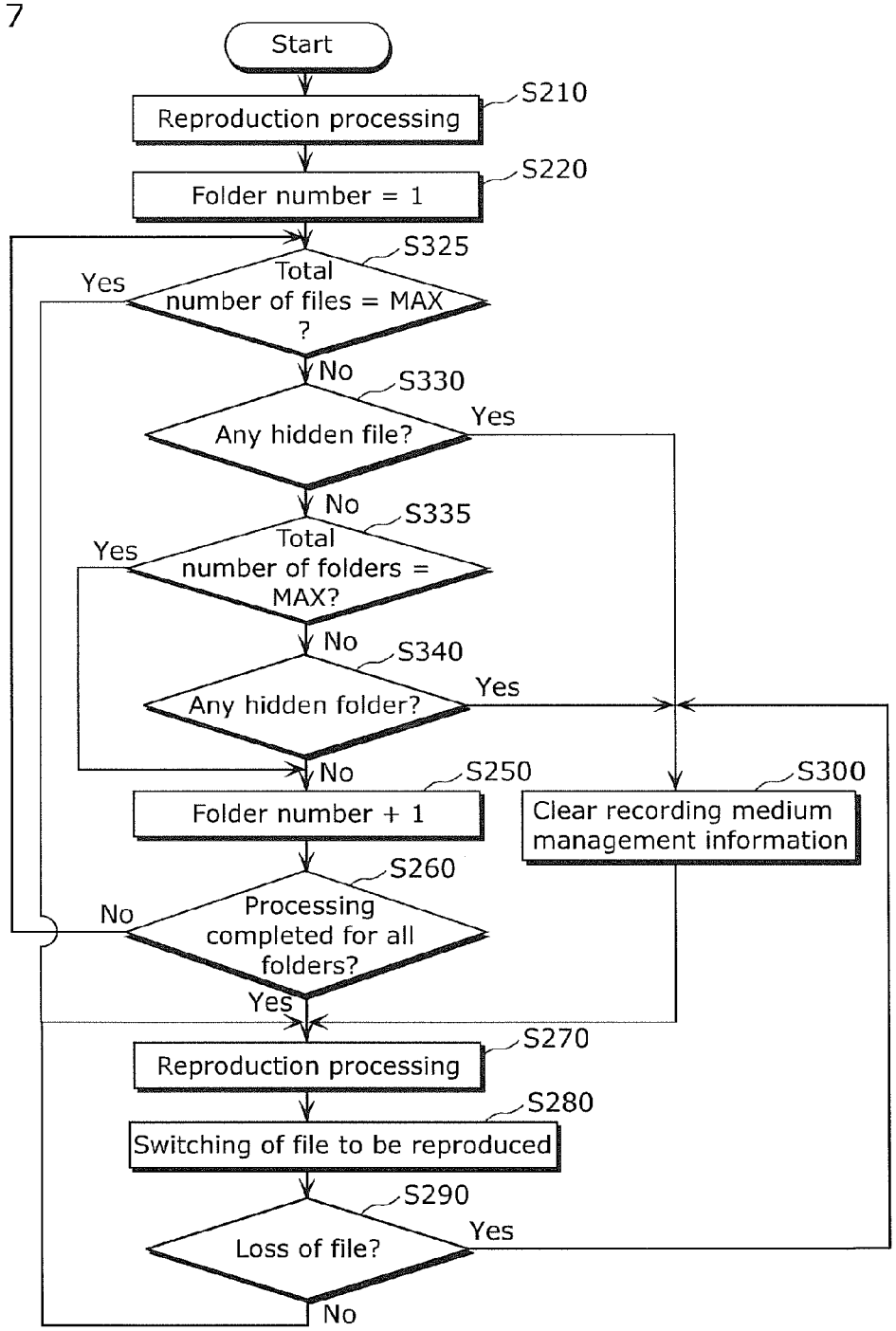
FIG. 7 is a flowchart showing an example of matching confirmation processing according to Embodiment 2 of the present invention.

In order to cope with such a case, the decoding device 100 according to Embodiment 2 of the present invention performs operations as illustrated in FIG. 7. FIG. 7 is a flowchart showing an example of operations performed by the decoding device 100 according to Embodiment 2 of the present invention. Note that in FIG. 7, the same operations as those in FIG.

4 are given the same reference numerals, and descriptions thereof will be omitted from the following description.

As illustrated in FIG. 7, the matching confirmation unit 143 determines whether or not the total number of files indicated by the file analysis information (previously-acquired file analysis information) that is read out from the RAM 332 matches the "maximum analyzable number of files" (S325). If the total number of files indicated by the previously-acquired file analysis information matches the "maximum analyzable number of files" (Yes in step S325), the procedure directly proceeds to the reproduction processing (S270) without performing the search for hidden folders and the search for hidden files.

If the total number of files indicated by the previously-acquired file analysis information does not match the "maximum analyzable number of files" (No in step S325), the matching confirmation unit 143 confirms the presence or absence of a hidden file (S330). Specific processing is the same as that in step S240 of Embodiment 1, and a description thereof will be omitted.

Next, the matching confirmation unit 143 determines whether or not the total number of folders indicated by the file analysis information (previously-acquired file analysis information) that is read out from the RAM 332 matches the "maximum analyzable number of folders" (S335). If the total number of folders indicated by the previously-acquired file analysis information matches the "maximum analyzable number of folders" (Yes in step S335), the matching confirmation unit 143 increments the folder number by one (S250) without performing the search for hidden folders and repeats the above-described processing for the next folder.

If the total number of folders indicated by the previously-acquired file analysis information does not match the "maximum analyzable number of folders" (No in step S335), the matching confirmation unit 143 confirms the presence or absence of a hidden folder (S340). Specific processing is the same as that in step S230 of Embodiment 1, and a description thereof will be omitted.

As described above, in the case where the number of files indicated by the previously-acquired file analysis information matches the "maximum analyzable number of files," the decoding device 100 according to Embodiment 2 of the present invention does not perform the matching confirmation. The decoding device 100 also does not perform the matching confirmation when the number of folders indicated by the previously-acquired file analysis information matches the "maximum analyzable number of folders."

In this way, by omitting the matching confirmation and performing the "loss-of-file detection," the amount of processing can be reduced. Because it is highly likely that a hidden file exists when the number of files indicated by the previously-acquired file analysis information matches the "maximum analyzable number of files," performing the "loss-of-file detection" without performing the matching confirmation is more efficient in determining the presence or absence of a file.

While the above has been a description of the decoding devices and decoding methods according to the present invention with reference to embodiments, the present invention is not intended to be limited to these embodiments. Those skilled in the art will readily appreciate that many modifications are possible in the exemplary embodiments without materially departing from the novel teachings and advantages of the present invention. Accordingly, all such modifications are intended to be included within the scope of the present invention.

The processing units included in the decoding devices according to Embodiments 1 and 2 described above are typically realized as large scale integration (LSI) as an integrated circuit. These processing units may be individually embedded in a single chip, or some or all of them may be integrated into a single chip.

The "LSI" as used here may also be referred to as an integrated circuit (IC), system LSI, super LSI, or ultra LSI depending on a difference in the level of integration. The system LSI is ultra multifunctional LSI manufactured by integrating a plurality of constituent elements on a single chip. One specific example is a computer system constituted by, for example, a microprocessor, a ROM, and a RAM.

The integration technique is not limited to LSI technology, and it may be realized by a dedicated circuit or a general-purpose processor. It is also possible to use a field programmable gate array (FPGA) that can be programmed after the manufacture of LSI, or a reconfigurable processor that can reconfigure connection and settings of circuit cells in the LSI.

If another integration technology that can replace LSI technology comes along due to advancements in semiconductor technology or other spin-off technology, naturally such technology may be used for the integration of the processing units. One possible example is the application of biotechnology.

The present invention can be realized not only as a decoding device or a decoding method as described above, but also as a program for causing a computer to execute the decoding method according to any of the embodiments. The present invention may also be realized as a computer-readable recording medium such as a CD-ROM that records the above program. Furthermore, the present invention may also be realized as information, data, or signals that indicate the above program. Such a program, information, data, and signals may be distributed via a communication network such as the Internet.

The configurations of the above-described decoding devices are merely examples for describing the present invention in detail, and the decoding device according to the present invention do not necessarily have to include all of the above-described constituent elements. In other words, it is sufficient for the decoding device according to the present invention to include only the minimum of constituent elements that allow the advantageous effects of the present invention to be realized.

For example, the decoding device 100 in FIG. 1 does not necessarily have to include the operation unit 150.

Similarly, the decoding methods performed by the above-described decoding devices are merely examples for describing the present invention in detail, and the decoding method performed by the decoding device according to the present invention does not necessarily have to include all of the above-described steps. In other words, it is sufficient for the decoding method according to the present invention to include only the minimum of steps that allow the advantageous effects of the present invention to be realized. The orders in which the above-described steps are executed are also merely examples for describing the present invention in detail, and the steps may be executed in an order other than the above-described order. Alternatively, some of the above-described steps may be executed simultaneously (in parallel) with the other steps.

INDUSTRIAL APPLICABILITY

The present invention can be utilized as a decoding device for decoding files in an external recording medium. For example, the present invention can be used in, for example, a digital audio player or a digital video player.

The invention claimed is:

1. A decoding device comprising:
an interface unit connectable to an external recording medium on which an encoded file and recording medium management information that indicates an attribute of the external recording medium are recorded;
a readout unit configured to read out the file and the recording medium management information from the external recording medium when the external recording medium is connected to the interface unit;
a decoding unit configured to generate file analysis information that indicates a content of the file read out by the readout unit, through analysis of the content of the file;
a storage unit configured to store the file analysis information and the recording medium management information of the external recording medium connected to the interface unit before;
a determination unit configured to determine whether or not new recording medium management information is the same as the recording medium management information stored in the storage unit, the new recording medium management information being newly read out by the readout unit at a given time in a state in which the external recording medium is connected to the interface unit; and
a matching confirmation unit configured to perform matching confirmation when the determination unit determines that the new recording medium management information is the same as the recording medium management information stored in the storage unit, the matching confirmation involving determining whether or not a file structure indicated by the file analysis information stored in the storage unit matches a file structure of the file recorded on the external recording medium in a state in which the external recording medium is connected to the interface unit,
wherein the decoding unit is further configured to:
when the matching confirmation unit determines that the file structures do not match, newly generate file analysis information through analysis of a content of the file read out by the readout unit and perform decoding processing on the file, using the generated file analysis information; and
when the matching confirmation unit determines that the file structures match, perform decoding processing on the file, using the file analysis information stored in the storage unit.

2. The decoding device according to claim 1,
wherein the decoding unit is configured to, when the matching confirmation unit determines that the file structures do not match, analyze the content of the file read out by the readout unit without performing the decoding processing.

3. The decoding device according to claim 1,
wherein the decoding unit is configured to, when the matching confirmation unit determines that the file structures do not match, at a time at which power supply to the decoding device is to be cut off or at a time at which the external recording medium is detached from the decoding device and again connected to the decoding device, analyze the content of the file read out by the readout unit without the determination by the determination unit.

4. The decoding device according to claim 1, further comprising
an operation unit configured to output a reproduction request to reproduce the file recorded on the external recording medium, based on an instruction from a user,
wherein the matching confirmation unit is configured to perform the matching confirmation when the reproduction request that is output from the operation unit is received.

5. The decoding device according to claim 1,
wherein the matching confirmation unit is configured to determine that the file structures do not match when it is detected that a file which is not stored in the storage unit exists in the external recording medium.

6. The decoding device according to claim 5,
wherein at least one folder, each including at least zero files, is stored in the external recording medium,
the file analysis information indicates the number of files for each folder, and
the matching confirmation unit is configured to determine that the contents do not match when it is detected, for each folder, that n+1 files exist in the external recording medium, n being the number of files indicated by the file analysis information.

7. The decoding device according to claim 6,
wherein the matching confirmation unit is configured to determine that the file structures do not match when a file name of an n+1th file is acquired from the external recording medium.

8. The decoding device according to claim 6,
wherein the matching confirmation unit is configured to determine that the file structures do not match when processing for opening an n+1th file is completed.

9. The decoding device according to claim 6,
wherein the matching confirmation unit is configured not to perform the matching confirmation when the number of files indicated by the file analysis information matches a predetermined number of files.

10. The decoding device according to claim 5,
wherein at least one folder, each including at least zero folders, is stored in the external recording medium,
the file analysis information indicates the number of folders for each folder, and
the matching confirmation unit is configured to determine that the file structures do not match when it is detected, for each folder, that m+1 folders exist in the external recording medium, m being the number of folders indicated by the file analysis information.

11. The decoding device according to claim 10,
wherein the matching confirmation unit is configured to determine that the file structures do not match when a folder name of an m+1th folder is acquired from the external recording medium.

12. The decoding device according to claim 10,
wherein the matching confirmation unit is configured to determine that the file structures do not match when processing for opening an m+1th folder is completed.

13. The decoding device according to claim 10,
wherein the matching confirmation unit is configured not to perform the matching confirmation when the number of folders indicated by the file analysis information matches a predetermined number of folders.

14. The decoding device according to claim 1,
wherein the matching confirmation unit is configured to determine that the file structures do not match when it is detected that a file stored in the storage unit does not exist in the external recording medium.

15. The decoding device according to claim 14,
wherein at least one folder, each including at least zero files, is stored in the external recording medium, and
the matching confirmation unit is configured to determine that the contents do not match when a file or a folder indicated by the file analysis information stored in the storage unit is not read out.

16. The decoding device according to claim 14,
wherein the matching confirmation unit is configured to determine that the file structures do not match when a file name of a file indicated by the file analysis information is not acquired.

17. The decoding device according to claim 14,
wherein the matching confirmation unit is configured to determine that the file structures do not match when processing for opening a file indicated by the file analysis information is not able to be completed.

18. The decoding device according to claim 14,
wherein the matching confirmation unit is configured to, for every file indicated by the file analysis information, confirm whether or not the file exists in the external recording medium.

19. The decoding device according to claim 14,
wherein the matching confirmation unit is configured to, for every folder indicated by the file analysis information, confirm whether or not the folder exists in the external recording medium.

20. The decoding device according to claim 1, further comprising
an operation unit configured to output a reproduction request to reproduce a file recorded on the external recording medium, based on an instruction from a user,
wherein the matching confirmation unit is configured to perform the matching confirmation on a file indicated by the reproduction request that is output from the operation unit.

21. The decoding device according to claim 1, further comprising
an operation unit configured to output a special reproduction request to make a special reproduction of a file recorded on the external recording medium, based on an instruction from a user,
wherein the matching confirmation unit is configured to stop the matching confirmation when the special reproduction request is received from the operation unit.

22. A decoding method comprising:
reading out an encoded file and recording medium management information that indicates an attribute of the external recording medium from an external recording medium and storing the read out recording medium management information into a storage unit, when the external recording medium on which the file and the recording medium management information are recorded is connected to an interface unit connectable to the external recording medium;
generating file analysis information that indicates a content of the file read out in the reading out, through analysis of the content of the file, and storing the generated file analysis information into the storage unit;
determining whether or not new recording medium management information is the same as the recording medium management information stored in the storage unit, the new recording medium management information being newly read out at a given time in a state in which the external recording medium is connected to the interface unit; and
when it is determined in the determining that the new recording medium management information is the same as the recording medium management information stored in the storage unit, performing matching confirmation that involves determining whether or not a file structure indicated by the file analysis information stored in the storage unit matches a file structure of the file recorded on the external recording medium,
wherein in the decoding,
when it is determined in the matching confirming that the file structures do not match, new file analysis information is generated through analysis of a content of a file that is newly read out, and decoding processing is performed on the file, using the generated file analysis information, and
when it is determined in the matching confirming that the file structures match, decoding processing is performed on the file, using the file analysis information stored in the storage unit.

* * * * *